(12) United States Patent
Furukawa et al.

(10) Patent No.: US 7,671,448 B2
(45) Date of Patent: Mar. 2, 2010

(54) SEMICONDUCTOR DEVICE INCLUDING TWO ORGANIC SEMICONDUCTOR LAYERS

(75) Inventors: Shinobu Furukawa, Kanagawa (JP); Ryota Imahayashi, Kanagawa (JP)

(73) Assignee: Semiconductor Energy Laboratory Co., Ltd., Atsugi-shi, Kanagawa-Ken (JP)

( * ) Notice: Subject to any disclaimer, the term of this patent is extended or adjusted under 35 U.S.C. 154(b) by 719 days.

(21) Appl. No.: 11/376,198

(22) Filed: Mar. 16, 2006

(65) Prior Publication Data

US 2006/0214160 A1 Sep. 28, 2006

(30) Foreign Application Priority Data

Mar. 24, 2005 (JP) ............................. 2005-087133

(51) Int. Cl.
  *H01L 35/24* (2006.01)
  *H01L 51/00* (2006.01)
  *H01L 29/04* (2006.01)
  *H01L 31/036* (2006.01)
  *H01L 31/153* (2006.01)
  *H01L 29/165* (2006.01)

(52) U.S. Cl. ............................. 257/642; 257/40; 257/51; 257/85; 257/94; 257/183; 257/190; 257/192; 257/E51.002; 257/E51.003; 257/E51.004; 257/E51.005; 257/E51.006; 257/E51.01; 257/E51.017

(58) Field of Classification Search .......... 257/E51.006, 257/40, E51.002, E51.003, E51.004, E51.005, 257/642, 51, 85, 94, 183, 190, 192, E51.01, 257/E51.017
See application file for complete search history.

(56) References Cited

U.S. PATENT DOCUMENTS 5,315,129 A * 5/1994 Forrest et al. ................. 257/21

(Continued)

FOREIGN PATENT DOCUMENTS

JP 2001-094107 4/2001

(Continued)

OTHER PUBLICATIONS

Yamashiro et al., "The Growth of High Quality $C_{60}$ Thin Film on Ultra Smooth Pentacene Buffer Layer", 51$^{st}$ Spring Meeting The Japan Society of Applied Physics and Related Societies, 28p-ZF-9, pp. 1343, Mar. 28, 2004.

(Continued)

*Primary Examiner*—Phat X Cao
*Assistant Examiner*—Diana C Garrity
(74) *Attorney, Agent, or Firm*—Nixon Peabody, LLP; Jeffrey L. Costellia

(57) ABSTRACT

It is an object of the present invention to form an organic transistor including an organic semiconductor having high crystallinity without loosing an interface between an organic semiconductor of a channel where carriers are spread out and a gate insulating layer and deteriorating a yield. A semiconductor device according to the present invention has a stacked structure of organic semiconductor layers, and at least the upper organic semiconductor layer is in a polycrystalline or a single crystalline state and the lower organic semiconductor layer is made of a material serving as a channel. Carrier mobility can be increased owing to the upper organic semiconductor layer having high crystallinity; thus, insufficient contact due to the upper organic semiconductor layer can be compensated by the lower organic semiconductor layer.

24 Claims, 9 Drawing Sheets

U.S. PATENT DOCUMENTS

| | | | |
|---|---|---|---|
| 5,500,537 A | * | 3/1996 | Tsumura et al. ............... 257/40 |
| 5,894,151 A | | 4/1999 | Yamazaki et al. |
| 6,278,127 B1 | * | 8/2001 | Dodabalapur et al. ......... 257/40 |
| 2002/0179901 A1 | | 12/2002 | Arai et al. |
| 2005/0247928 A1 | | 11/2005 | Unno |
| 2006/0202196 A1 | * | 9/2006 | Kawakami et al. ............ 257/40 |

FOREIGN PATENT DOCUMENTS

| | | |
|---|---|---|
| JP | 2004-023021 | 1/2004 |
| WO | WO 2006-016669 A1 | 2/2006 |

OTHER PUBLICATIONS

Yamaguchi et al., "Fabrication and Characterization of Fullerene FET With a Pentacene Monolayer", 53$^{rd}$ Spring Meeting The Japan Society of Applied Physics and Related Societies, 23a-ZG-9, pp. 1414, Mar. 22, 2006.

* cited by examiner

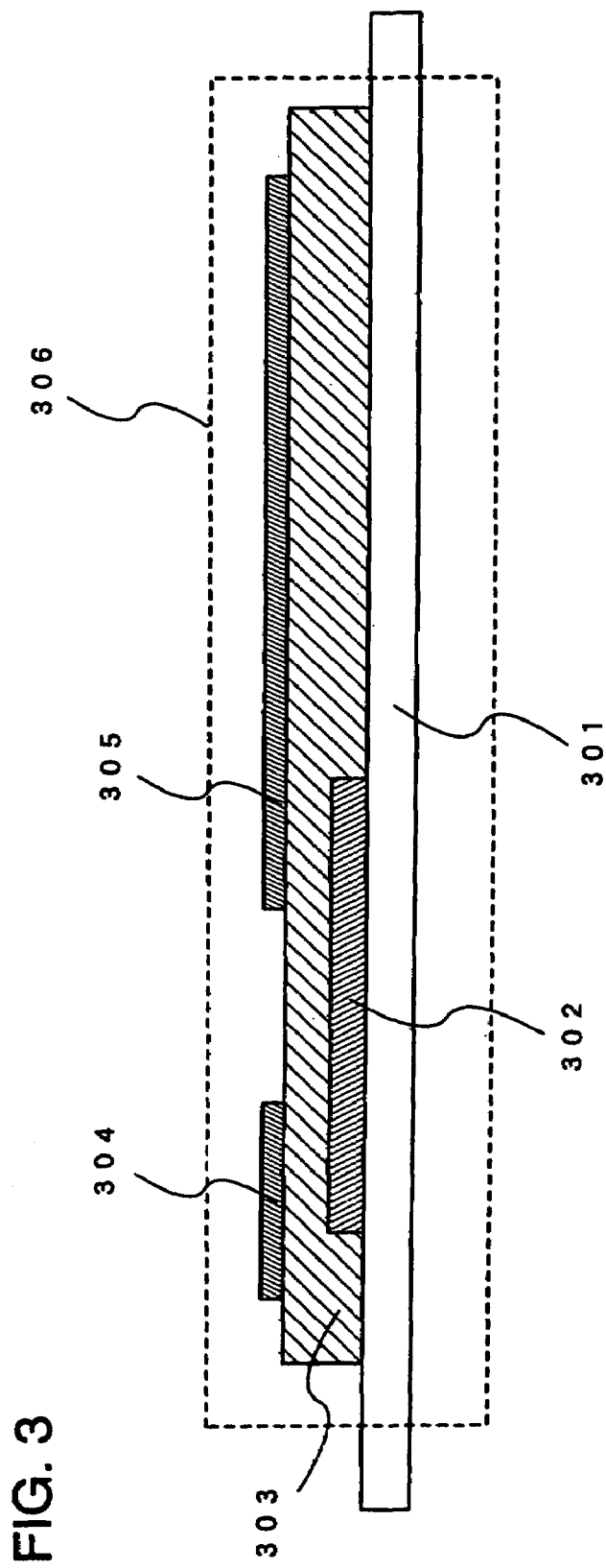

SEMICONDUCTOR DEVICE INCLUDING TWO ORGANIC SEMICONDUCTOR LAYERS

BACKGROUND OF THE INVENTION

1. Field of the Invention

The present invention relates to a semiconductor device using an organic semiconductor and a manufacturing method thereof.

2. Description of the Related Art

In recent years, a study of an organic transistor using an organic semiconductor has been actively carried out. It is expected that a thin film is easily formed and that an organic semiconductor device is formed over a flexible substrate such as plastic, a film substrate, or a paper which is lightweight with flexibility by making the most of the characteristic of an organic semiconductor. Further, an organic semiconductor material for forming a channel is extremely inexpensive and low in deposition temperature, and a process without using a vacuum chamber such as an ink-jet method, a printing method, a stamp method, or the like can also be applied. Therefore, it is expected to drastically reduce the manufacturing cost of a general semiconductor device using an organic transistor.

An organic transistor is composed of a glass substrate, a gate electrode, a gate insulating layer, source and drain electrodes, and an organic semiconductor layer. A structure where source and drain electrodes are provided below an organic semiconductor layer is referred to as a bottom contact structure and a structure where a source and drain electrodes are provided over an organic semiconductor layer is referred to as a top contact structure.

In the case of an organic transistor, carrier mobility can be increased by employing the top contact structure. However, it is difficult to use a step such as photolithography to perform microfabrication of pattern or the like in this structure; thus, microfabrication may be limited to the bottom contact structure where an organic semiconductor layer is formed after forming source and drain electrodes. Therefore, the structure of an organic transistor needs to be applied in accordance with an advantage and a disadvantage of each structure.

It is known that carrier mobility of an organic transistor largely depends on morphology (an amorphous, polycrystalline, single crystalline state, or the like) of an organic semiconductor. In particular, an organic transistor using a single crystal of an organic semiconductor layer shows high carrier mobility and has carrier mobility almost the same as that of amorphous silicon. A liquid phase growth method, a vapor-phase transport method, or the like can be given as a method for obtaining a favorable single crystal of an organic material.

In order to improve characteristics by actively using a single crystal for an organic transistor, a technique for selectively coating a position where a single crystal is made to grow is necessary. In coating a single crystal in such a manner, such a method as wettability of a substrate portion is reformulated to selectively grow a single crystal is typically used.

As an example where a single crystal of an organic semiconductor layer is used, a structure where an island-shaped projection layer in which island-shaped projections having low surface energy are formed by being dispersed is provided over a surface of a gate insulating layer is suggested in order to suppress a crystalline state of a pentacene deposited film and to provide an organic semiconductor element having high carrier mobility with low voltage driving (for example, see Reference 1: Japanese Patent Application Laid-Open No. 2004-23021).

In addition, an organic transistor the characteristic of which is to form a fluorine polymer layer over a surface of a gate insulating layer is suggested by limiting a contact angle of deionized water with respect to the surface of a gate insulating layer to 50° C. or more and 120° C. or less (for example, see Reference 2: Japanese Patent Application Laid-Open No. 2001-94107).

When a single crystal of an organic semiconductor layer is formed as in the above Reference 1, an interface between an organic semiconductor of a channel where carriers are spread out and a gate insulating layergate insulating layer looses its planarity; therefore, it is hard to say that carrier mobility of a single crystal of an organic semiconductor layer is utilized sufficiently.

In addition, in the above Reference 2, a yield is to deteriorate when a single crystal of an organic semiconductor layer cannot be grown through the entire channel.

SUMMARY OF THE INVENTION

Thus, it is an object of the present invention to efficiently apply a single crystal of an organic semiconductor layer or a film having high crystallinity to an organic transistor.

In view of the above object, a semiconductor device according to the present invention has a stacked structure of organic semiconductor layers, and at least the upper organic semiconductor layer is in a polycrystalline or a single crystalline state and the lower organic semiconductor layer is made of a material serving as a channel. In this case, the crystal grain size of a single crystal is larger than one crystal grain size in a polycrystal. The lower organic semiconductor layer has crystallinity the same or less than that of the upper organic semiconductor layer. Carrier mobility can be increased owing to the upper organic semiconductor layer having high crystallinity. In addition, even when a crystal of the upper organic semiconductor layer is not grown sufficiently for a channel area in a direction parallel to a substrate, insufficient contact can be compensated because the lower organic semiconductor layer is in contact with source and drain electrodes.

There is an organic semiconductor layer in a single crystal as an example of an organic semiconductor layer having high crystallinity. It is considered that such an organic semiconductor layer having high crystallinity has insufficient physical contact of the single crystal with source and drain electrodes or with a gate insulating layer depending on a crystal condition or a crystalline state, for example, in a case where a crystal is not grown sufficiently for a channel area in a direction parallel to a substrate. However, even in such a case, the organic semiconductor layer provided in the lower layer can compensate insufficient contact and thus can serve as a channel by being in contact with source and drain electrodes or a gate insulating layer.

Specifically, a single crystal of an organic semiconductor layer is used in the upper layer of the stacked organic semiconductor layers and a polycrystalline organic semiconductor layer is used in the lower layer in order to improve carrier mobility of the organic semiconductors. Of course, the lower organic semiconductor layer preferably has the same crystalline state as the upper organic semiconductor layer. This is because electrical resistance of carrier mobility can be further reduced. According to the present invention, an amorphous organic semiconductor layer can also be used for the lower organic semiconductor layer. This is because it is possible to accomplish effect that insufficient contact of a single crystal with source and drain electrodes is compensated even in an amorphous state.

In another mode, a polycrystalline organic semiconductor layer can be used for the upper organic semiconductor layer and an amorphous organic semiconductor layer can be used for the lower organic semiconductor layer. Of course, the lower organic semiconductor layer preferably has the same crystalline state as the upper organic semiconductor layer.

This is because electrical resistance of carrier mobility can be further reduced.

In other words, the lower organic semiconductor layer has lower crystallinity than that of the upper organic semiconductor layer and the lower organic semiconductor layer may be formed with a material that serves as a channel.

A vapor-phase transport method can be used as a deposition method of a single crystalline organic semiconductor layer. Then, a single crystalline organic semiconductor layer can be selectively formed along the lower organic semiconductor layer which is selectively formed. In other words, it becomes possible to selectively grow a single crystal between channels owing to the lower organic semiconductor layer.

Specifically, according to one feature of the present invention, a semiconductor device comprises a gate electrode; a first organic semiconductor layer provided over the gate electrode through a gate insulating layer; and a second organic semiconductor layer provided over the first organic semiconductor layer to be in contact therewith, wherein the second organic semiconductor layer has crystallinity higher than that of the first organic semiconductor layer.

According to another feature of the present invention, a semiconductor device comprises a gate electrode; a first organic semiconductor layer provided over the gate electrode through a gate insulating layer; and a second organic semiconductor layer provided over the first organic semiconductor layer to be in contact therewith, wherein the second organic semiconductor layer has a crystal grain larger than that of the first organic semiconductor layer.

According to another feature of the present invention, a semiconductor device comprises a gate electrode; a first organic semiconductor layer provided over the gate electrode through a gate insulating layer; and a second organic semiconductor layer provided over the first organic semiconductor layer to be in contact therewith, wherein the first organic semiconductor layer is polycrystalline or amorphous, and wherein the second organic semiconductor layer is single crystalline.

According to another feature of the present invention, a semiconductor device comprises a gate electrode; a first organic semiconductor layer provided over the gate electrode through a gate insulating layer; and a second organic semiconductor layer provided over the first organic semiconductor layer to be in contact therewith, wherein the first organic semiconductor layer is amorphous, and wherein the second organic semiconductor layer is polycrystalline.

According to another feature of the present invention, a semiconductor device comprises a gate electrode; a first organic semiconductor layer provided over the gate electrode through a gate insulating layer; and a second organic semiconductor layer provided over the first organic semiconductor layer to be in contact therewith, wherein the first organic semiconductor layer is single crystalline, and wherein the second organic semiconductor layer is single crystalline including a material different from the first organic semiconductor layer.

In addition, a specific method for manufacturing a semiconductor device according to the present invention will be shown.

According to one feature of the present invention, a method for manufacturing a semiconductor device comprises the steps of forming a gate electrode and a gate insulating layer over a substrate; forming a first organic semiconductor layer over the gate electrode through the gate insulating layer, and forming a second organic semiconductor layer in contact with the first organic semiconductor layer film, wherein the second organic semiconductor layer is formed to have a crystal grain larger than that of the first organic semiconductor layer.

According to another feature of the present invention, a method for manufacturing a semiconductor device comprises the steps of forming a gate electrode and a gate insulating layer over a substrate; forming a first organic semiconductor layer over the gate electrode through the gate insulating layer, and forming a second organic semiconductor layer in contact with the first organic semiconductor layer, wherein the second organic semiconductor layer is formed to have crystallinity higher than that of the first organic semiconductor layer.

According to another feature of the present invention, a method for manufacturing a semiconductor device comprises the steps of forming a gate electrode and a gate insulating layer over a substrate; forming a first organic semiconductor layer over the gate electrode through the gate insulating layer, and forming a second organic semiconductor layer in contact with the first organic semiconductor layer, wherein the first organic semiconductor layer is formed to be polycrystalline or amorphous, and wherein the second organic semiconductor layer is formed to be single crystalline.

According to another feature of the present invention, a method for manufacturing a semiconductor device comprises the steps of forming a gate electrode and a gate insulating layer over a substrate; forming a first organic semiconductor layer over the gate electrode through the gate insulating layer, and forming a second organic semiconductor layer in contact with the first organic semiconductor layer, wherein the first organic semiconductor layer is formed to be amorphous, and wherein the second organic semiconductor layer is formed to be polycrystalline.

According to the present invention, a single crystal of an organic semiconductor layer can be formed efficiently and selectively. The single crystal can be used as a channel forming region; thus, carrier mobility can be increased.

In addition, even when a single crystal of an organic semiconductor layer is not grown sufficiently for a channel area in a direction parallel to a substrate, by applying the present invention where a thin film of an organic semiconductor is formed in advance, the thin film of an organic semiconductor can serve as a channel that compensates insufficient growth of a single crystal when a second organic semiconductor layer is not formed sufficiently. Consequently, it is possible to provide an organic transistor with high carrier mobility in a preferable yield by preventing incomplete channel formation due to insufficient growth of a single crystal in an organic semiconductor layer.

Moreover, off current of an organic transistor can be reduced by improving adhesion between a single crystal of an organic semiconductor layer (or an organic semiconductor layer having high crystallinity) and a gate insulating layer by providing an organic semiconductor layer. In addition, as a result of improving contact between a single crystal of an organic semiconductor layer (or an organic semiconductor layer having high crystallinity) and source and drain electrodes in an organic semiconductor layer, it is possible to reduce an injection barrier of a carrier, increase on current, and reduce a shift in threshold voltage.

Further, since a single crystal is selectively grown according to the present invention, it is possible to reduce loss of an organic semiconductor material. It is a feature of the present invention to provide an organic transistor the operation of which is stabilized with a long lifetime and the manufacturing method of which is simple and easy.

These and other objects, features and advantages of the present invention will become more apparent upon reading of the following detailed description along with the accompanied drawings.

BRIEF DESCRIPTION OF THE DRAWINGS

In the accompanying drawings:

FIG. 3 is a cross-sectional view of a display element substrate according to the present invention;

DETAILED DESCRIPTION OF THE INVENTION

Hereinafter, one mode of the present invention will be explained. However, it is to be easily understood that various changes and modifications will be apparent to those skilled in the art. Therefore, unless such changes and modifications depart from the invention, they should be construed as being included therein.

Embodiment Mode 1

One mode of an organic transistor according to the present invention and a manufacturing method thereof will be explained with reference to FIGS. 1A to 1C.

A gate electrode 102 is formed over a substrate 101. The gate electrode 102 may be formed by patterning a deposited conductive layer into a desired shape by a photolithography method or by discharging a droplet containing a conductive material by an ink-jet method or the like. Note that the method for manufacturing the gate electrode 102 according to the present invention is not limited thereto. As a material for forming the gate electrode 102, for example, aluminum, copper, gold, silver, or the like can be used. Note that the material used for the gate electrode 102 according to the present invention is not limited thereto and any material is acceptable as long as the material has conductivity. In addition, as the substrate 101, a flexible substrate such as plastic or polycarbonate can be used in addition to glass, quartz, or the like. Note that the substrate used in the present invention is not limited thereto. In addition, since an organic transistor does not need high-temperature processing, a flexible substrate such as plastic or polycarbonate can be used; thus, weight saving and a thin shape of a semiconductor device can be achieved and flexibility thereof can be improved.

Next, a gate insulating layer 103 is formed to cover the gate electrode 102. The gate insulating layer 103 may be formed by depositing an insulator such as silicon oxide or silicon nitride by a CVD method or the like or may be formed by oxidizing the surface of the gate electrode with the use of an anodic oxidation method, for example. Alternatively, an organic material such as polyimide, polyamic acid, or polyvinylphenol may be coated by a method such as a cast method, a spinner method, a printing method, or an ink-jet method to form the gate insulating layer 103. Note that the gate insulating layer according to the present invention is not limited thereto.

Figure 1A:
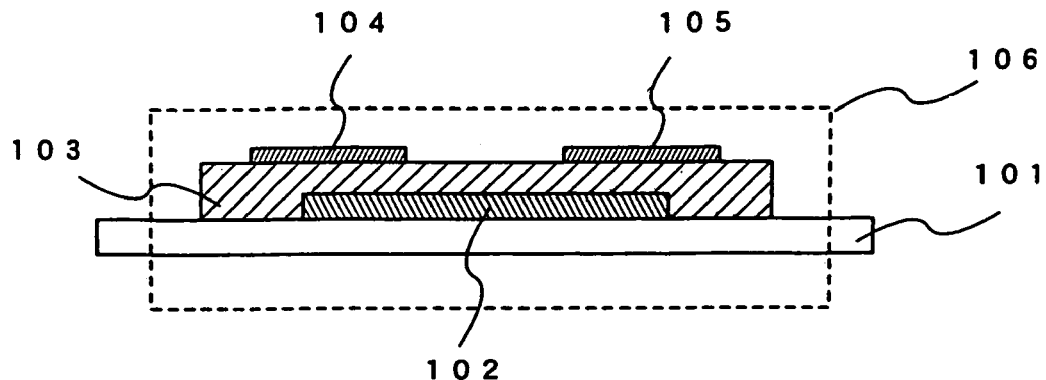
FIGS. 1A to 1C are views each showing a manufacturing process of an organic transistor according to the present invention and a cross section thereof.

Then, an organic transistor forming region 106 is manufactured by forming source and drain electrodes 104 and 105 over the gate insulating layer 103 (FIG. 1A). The source and drain electrodes 104 and 105 may be formed using an organic conductive material or the like containing poly (ethylene dioxythiophene)/poly (styrenesulfonic acid) mixture (PEDOT/PSS) or the like as well as an inorganic conductive material such as gold, silver, or tungsten. Note that the material of the source and the drain electrodes according to the present invention is not limited thereto. In addition, the source and drain electrodes 104 and 105 may be formed by patterning into a desired shape a conductive layer formed with a film forming apparatus such as a sputtering apparatus or a vapor deposition apparatus or may be formed by discharging a droplet containing a conductive material by an inkjet method or the like. Note that the method for manufacturing the source and drain electrodes according to the present invention is not limited thereto.

An organic semiconductor layer 107 is formed in a region for forming a single crystal of an organic semiconductor layer over the organic transistor forming region 106. The organic semiconductor layer 107 is formed at least between the source and drain electrodes. As a result of providing the organic semiconductor layer 107, a single crystal of an organic semiconductor layer can be formed efficiently thereover; thus, a single crystal can be grown from the region.

When a single crystal of an organic semiconductor layer is formed in this manner to increase carrier mobility of an organic transistor, it is considered that crystals are not formed over an entire channel area and thus physical contact with source and drain electrodes or a gate insulating layer become insufficient when a crystal is not grown sufficiently for a channel area in a direction parallel to a substrate, depending on a crystal condition or a crystalline state of a shape or the like of a crystal grain. Thus, according to the present invention, the organic semiconductor layer 107 compensates incomplete connection and serves as a channel by being in contact with the source and drain electrodes or the gate insulating layer. Therefore, any material of the organic semiconductor layer 107 is acceptable as long as the material serves as a channel. Such an organic semiconductor 107 is formed to be 2 nm or more and 10 nm or less in thickness.

For example, a phthalocyanine-based material such as phthalocyanine ($H_2Pc$), phthalocyanine copper (CuPc), titanyl phthalocyanine (TiOPc), or vanadyl phthalocyanine (VoPc), an acene-based material such as anthracene, tetracene, or pentacene, a thiophene-oligomer-based material such as sexithiophene ($\alpha$-6T) or quarterthiophene ($\alpha$-4T), or other material such as fullerene (C60) or perylene can be used to form the organic semiconductor layer 107. However, it is desirable to use an organic semiconductor having high carrier mobility such as anthracene, tetracene, or pentacene. The organic semiconductor having high mobility such as anthracene, tetracene, or pentacene can subsequently form a single crystal of an organic semiconductor layer. Accordingly, the organic semiconductor layer 107 is preferable in terms of adhesion or a manufacturing process when being formed with the same material as a single crystal of an organic semiconductor layer that will be subsequently formed.

However, the organic semiconductor layer 107 according to the present invention is not limited thereto, and an organic compound such as an aromatic amine compound typified by 4,4'-bis[N-(1-naphthyl)-N-phenylamino]biphenyl (abbreviation: $\alpha$-NPD), 4,4'-bis[N-(3-methylphenyl)-N-phenylamino] biphenyl (abbreviation: TPD), 4,4',4"-tris(N,N-diphenylamino)triphenylamine (abbreviation: TDATA), 4,4',4"-tris [N-(3-methylphenyl)-N-phenylamino]triphenylamine (abbreviation: MTDATA), or 4,4'-bis[N-{4-(N,N-di-m-tolylamino)phenyl}-N-phenylamino]biphenyl (abbreviation: DNTPD) can be used.

Such an organic semiconductor layer 107 can be formed using a vapor deposition method, an ink-jet method, a printing method, a stamp method, or the like. In a case of using a vapor deposition method or the like, the organic semiconductor layer 107 can be selectively formed using a mask. Note that the method for manufacturing the organic semiconductor layer according to the present invention is not limited thereto.

The organic semiconductor layer 107 can bring about an effect of the present invention when an organic semiconductor layer having the same crystal state as that of a single crystal of an organic semiconductor layer that will be subsequently formed is used. For example, in a case of using a single crystal of an organic semiconductor layer as an organic semiconductor layer that will be subsequently formed, it is preferable to use an organic semiconductor layer having such high crystallinity as that in a single crystalline or a polycrystalline state for the organic semiconductor layer 107. In addition, in a case of forming a polycrystalline organic semiconductor layer, it is preferable to use an organic semiconductor layer in a polycrystalline state for the organic semiconductor layer 107.

Figure 1B:
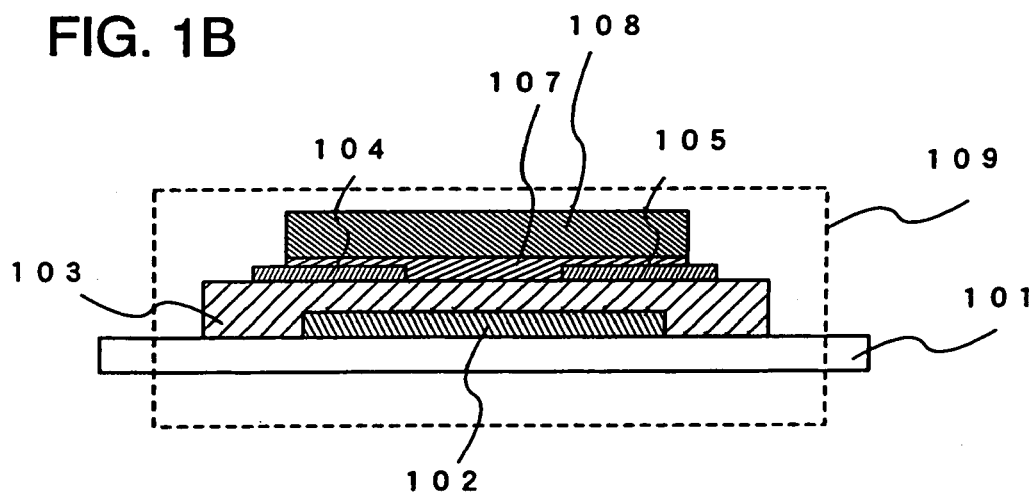
Figure 1C:
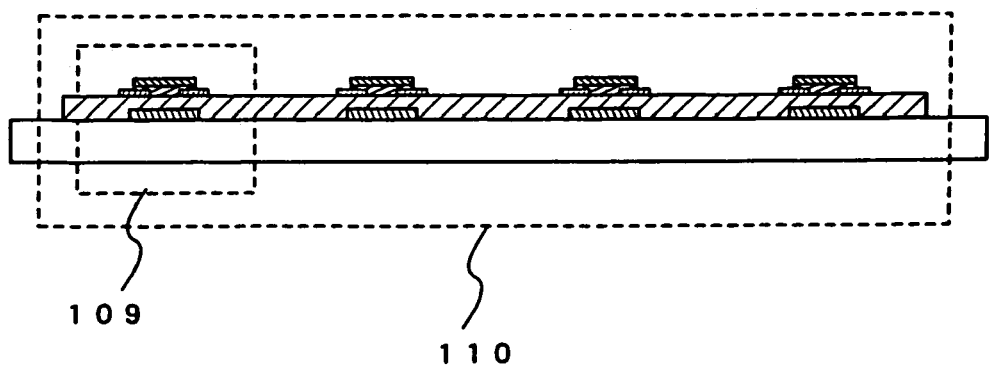

Next, a single crystal 108 of an organic semiconductor layer is formed over the organic semiconductor layer 107 as an organic semiconductor layer having high crystallinity to form an organic transistor 109 (FIG. 1B). Since the organic semiconductor layer 107 is formed in advance, the single crystal 108 of an organic semiconductor layer can be formed selectively and efficiently; thus, crystal growth can be realized. The single crystal can be used as a channel forming region and can increase carrier mobility. In addition, the organic semiconductor layer 107 that is formed in advance can be used as a nucleus of the single crystal.

In addition, a phthalocyanine-based material such as phthalocyanine ($H_2Pc$), phthalocyanine copper (CuPc), titanyl phthalocyanine (TiOPc), or vanadyl phthalocyanine (VoPc), an acene-based material such as anthracene, tetracene, or pentacene, a thiophene-oligomer-based material such as sexithiophene ($\alpha$-6T) or quarterthiophene ($\alpha$-4T), or other material such as fullerene (C60) or perylene can be used to form the single crystal 108 of an organic semiconductor layer by an OMBE (Organic Molecular Beam Epitaxy), an HWE (Hot Wall Epitaxy) method, or a Vapor-phase Transport method such as a PVT (Physical Vapor Transport) method.

Accordingly, the upper organic semiconductor layer has a feature of crystallinity higher than that of the lower organic semiconductor layer. High crystallinity also means that the grain size is large. Then, according to the organic semiconductor layer having high crystallinity, carrier mobility can be increased and, when the organic semiconductor layer has insufficient contact with the source and drain electrodes or the gate insulating layer, the lower organic semiconductor layer can compensate the insufficient contact by being in contact with the source and drain electrodes or the gate insulating layer.

Note that a large number of carriers flow on the side of the gate insulating layer of the organic semiconductor layer in the organic transistor. Therefore, a region where carriers easily flow is separated from the single crystal which is low in resistance depending on a film thickness of the organic semiconductor layer 107 provided for compensating the insufficient contact; thus, there is a fear that carriers do not efficiently flow on the single crystal side. Thus, the film thickness of the organic semiconductor layer 107 is preferably 2 nm or more and 10 nm or less.

Further, even in a case where a plurality of the organic transistor 109 is included over the substrate 101, an organic semiconductor device 110 (FIG. 1C) can be formed through the same process.

As mentioned above, since the organic semiconductor layer 107 is formed in advance in the organic transistor 109 manufactured according to the present invention, the single crystal 108 of an organic semiconductor layer can be selectively formed and thereafter crystal growth can be realized. The single crystal can be used as a channel forming region and carrier mobility can be increased.

Furthermore, there is a case where a crystal is not grown sufficiently for a channel area in a direction parallel to a substrate only with the single crystal 108 of an organic semiconductor layer. In such a case, the organic semiconductor layer 107 formed below the single crystal 108 of an organic semiconductor layer serves as a channel by being in contact with the source and drain electrodes or the gate insulating layer; thus, a yield can be improved.

Figure 9A:
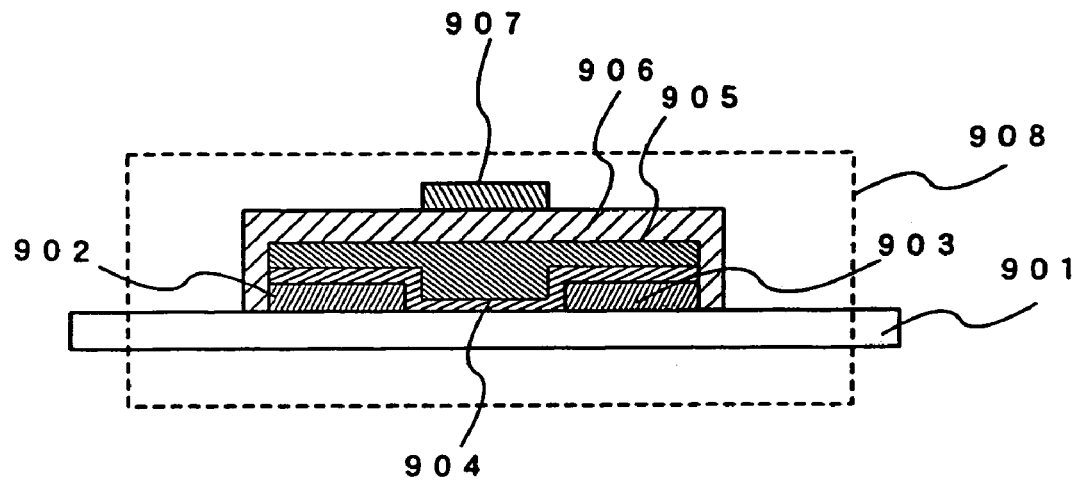
FIGS. 9A to 9B are views each showing a cross section of an organic transistor according to the present invention.

In addition, adhesion between the single crystal 108 of an organic semiconductor layer and the gate insulating layer 103 can be improved by providing the organic semiconductor layer 107. Consequently, off current of the organic transistor 109 can be decreased. Moreover, contact of the single crystal 108 of an organic semiconductor layer with the source and drain electrodes 104 and 105 can be improved by the organic semiconductor layer 107. Consequently, it is possible to reduce an injection barrier of a carrier, increase on current, and reduce a shift in threshold voltage. In this embodiment mode, a bottom-gate organic transistor is explained. However, the present invention also can be applied to a top-gate organic transistor. A top-gate organic transistor 908 according to this embodiment mode and a manufacturing method thereof will be explained with reference FIG. 9A. Firstly, a source electrode 902 and a drain electrode 903 are formed over the substrate 901 by using a well-known method. Secondly, a first organic semiconductor layer 904 is formed over the source electrode 902 and the drain electrode 903 by using a vapor deposition method, an ink-jet method, a printing method, a stamp method, or the like. Thirdly, a second organic semiconductor layer 905 is formed over the first organic semiconductor layer 904 by using an OMBE method, an HWE method, or a vapor-phased transport method such as a PVT. Then, a gate electrode 907 is formed over the second organic semiconductor layer 905 through a gate insulating layer 906 by using a well-known method.

Embodiment Mode 2

Figure 2A:
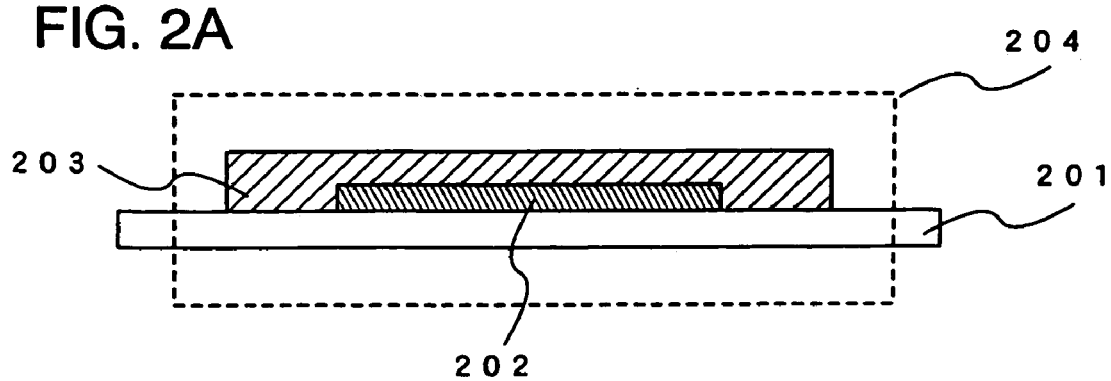
FIGS. 2A to 2C are views each showing a manufacturing process of an organic transistor according to the present invention and a cross section thereof.

One mode of an organic transistor according to the present invention and a manufacturing method thereof will be explained with reference to FIGS. 2A to 2C.

A gate electrode 202 is formed over a substrate 201. The gate electrode 202 may be formed by patterning a deposited conductive layer into a desired shape by a photolithography method or by discharging a droplet containing a conductive material by an ink-jet method or the like. However, the method for manufacturing the gate electrode 202 according to the present invention is not limited thereto. As a material for forming the gate electrode 202, for example, aluminum, copper, gold, silver, or the like can be used. However, the material used for the gate electrode 202 according to the present invention is not limited thereto. In addition, as the substrate 201, a flexible substrate such as plastic or polycarbonate can be used in addition to glass, quartz, or the like. Note that the organic transistor does not need high-temperature processing at 600° C. or more; therefore, a flexible substrate such as plastic or polycarbonate can be used; thus, weight saving and a thin shape of a semiconductor device can be achieved and flexibility thereof can be improved.

Next, a gate insulating layer 203 is formed to cover the gate electrode 202. The gate insulating layer 203 may be formed by depositing an insulator such as silicon oxide or silicon nitride by a CVD method or the like or may be formed by oxidizing the surface of the gate electrode with the use of an anodic oxidation method, for example. Alternatively, an organic material such as polyimide, polyamic acid, or polyvinylphenol may be coated by a method such as a cast method, a spinner method, a printing method, or an ink-jet method to form the gate insulating layer 203. Accordingly, an organic transistor forming region 204 is manufactured (FIG. 2A).

An organic semiconductor layer 205 is formed in a region for forming a single crystal of an organic semiconductor layer over the organic transistor forming region 204. The organic semiconductor layer 205 is formed at least between the source and drain electrodes. As a result of providing the organic semiconductor layer 205, a single crystal of an organic semiconductor layer can be formed efficiently thereover; thus, a single crystal can be grown from the region.

When a single crystal of an organic semiconductor layer is formed in this manner to increase carrier mobility of an organic transistor, it is considered that contact with source and drain electrodes become insufficient when a crystal is not grown sufficiently for a channel area in a direction parallel to a substrate, depending on a crystal condition or a crystalline state of a shape or the like of a crystal grain. Thus, the organic semiconductor layer 205 according to the present invention compensates incomplete connection and serve as a channel. Therefore, any material of the organic semiconductor layer 205 is acceptable as long as the material serves as a channel. Such an organic semiconductor 205 is formed to be 2 nm or more and 10 nm or less in thickness.

For example, a phthalocyanine-based material such as phthalocyanine ($H_2Pc$), phthalocyanine copper (CuPc), titanyl phthalocyanine (TiOPc), or vanadyl phthalocyanine (VoPc), an acene-based material such as anthracene, tetracene, or pentacene, a thiophene-oligomer-based material such as sexithiophene ($\alpha$-6T) or quarterthiophene ($\alpha$-4T), or other material such as fullerene (C60) or perylene can be used to form the organic semiconductor layer 205. However, it is desirable to use an organic semiconductor having high carrier mobility such as anthracene, tetracene, or pentacene. The organic semiconductor having high mobility such as anthracene, tetracene, or pentacene can subsequently form a single crystal of an organic semiconductor layer. Accordingly, the organic semiconductor layer 205 is preferable in terms of adhesion or a manufacturing process when being formed with the same material as a single crystal of an organic semiconductor layer that will be subsequently formed.

However, the organic semiconductor layer 205 according to the present invention is not limited thereto, and an organic compound such as an aromatic amine compound typified by 4,4'-bis[N-(1-naphthyl)-N-phenylamino]biphenyl (abbreviation: $\alpha$-NPD), 4,4'-bis[N-(3-methylphenyl)-N-phenylamino]biphenyl (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), or 4,4'-bis[N-{4-(N,N-di-m-tolylamino)phenyl}-N-phenylamino]biphenyl (abbreviation: DNTPD) can be used.

Such an organic semiconductor layer 205 can be formed using a vapor deposition method, an ink-jet method, a printing method, a stamp method, or the like. In a case of using a vapor deposition method, the organic semiconductor layer 205 can be selectively formed using a mask. Note that the method for manufacturing the organic semiconductor layer according to the present invention is not limited thereto.

The organic semiconductor layer 205 can bring about an effect of the present invention when an organic semiconductor layer having the same crystal state as that of a single crystal of an organic semiconductor layer that will be subsequently formed is used. For example, in a case of using a single crystal of an organic semiconductor layer as an organic semiconductor layer that will be subsequently formed, it is preferable to use for the organic semiconductor layer 205 an organic semiconductor layer having such high crystallinity as that in a single crystalline or a polycrystalline state. In addition, in a case of forming a polycrystalline organic semiconductor layer, it is preferable to use an organic semiconductor layer in a polycrystalline state for the organic semiconductor layer 205.

Next, a single crystal 206 of an organic semiconductor layer is formed over the organic semiconductor layer 205 as an organic semiconductor layer having high crystallinity. Since the organic semiconductor layer 205 is formed in advance, the single crystal 206 of an organic semiconductor layer can be formed selectively and efficiently; thus, crystal growth can be realized. The single crystal can be used as a channel forming region and can increase carrier mobility. In addition, the organic semiconductor layer 205 formed in advance can be used as a nucleus of the single crystal.

In addition, a phthalocyanine-based material such as phthalocyanine ($H_2Pc$), phthalocyanine copper (CuPc), titanyl phthalocyanine (TiOPc), or vanadyl phthalocyanine (VoPc), an acene-based material such as anthracene, tetracene, or pentacene, a thiophene-oligomer-based material such as sexithiophene ($\alpha$-6T) or quarterthiophene ($\alpha$-4T), or other material such as fullerene (C60) or perylene can be used to form the single crystal 206 of an organic semiconductor layer by a vapor-phase transport method.

Accordingly, the upper organic semiconductor layer has a feature of crystallinity higher than that of the lower organic semiconductor layer. High crystallinity also means that the grain size is large. Then, according to the organic semiconductor layer having high crystallinity, carrier mobility can be increased and, when the organic semiconductor layer has insufficient contact with the source and drain electrodes or the gate insulating layer, the lower organic semiconductor layer can compensate the insufficient contact.

A large number of carriers flow on the side of the gate insulating layer of the organic semiconductor layer in the organic transistor. Therefore, a region where carriers easily flow is separated from the single crystal which is low in resistance depending on a film thickness of the organic semiconductor layer 205 provided for compensating the insufficient contact and thus there is a fear that carriers do not efficiently flow on the single crystal side. Thus, the film thickness of the organic semiconductor layer 107 is preferably 2 nm or more and 10 nm or less.

Figure 2B:
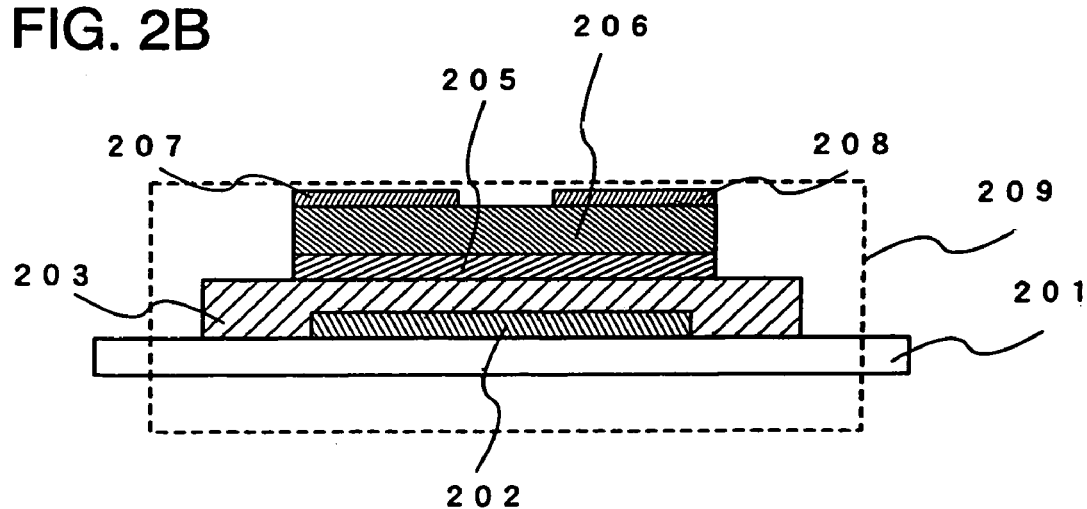
Figure 2C:
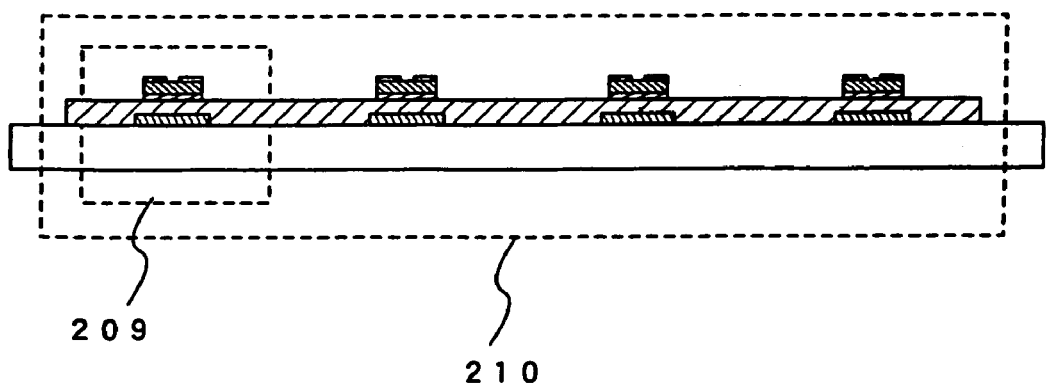

Next, an organic transistor 209 is completed by forming source and drain electrodes 207 and 208 over the single crystal 206 of an organic semiconductor layer (FIG. 2B). The source and drain electrodes 207 and 208 may be formed using an organic conductive material or the like containing poly (ethylene dioxythiophene)/poly (styrenesulfonic acid) mixture (PEDOT/PSS) or the like as well as an inorganic conductive material such as gold, silver, or tungsten. However, the material of the source and drain electrodes according to the present invention is not limited thereto. In addition, the source and drain electrodes 207 and 208 may be formed by patterning into a desired shape a conductive layer formed with a film forming apparatus such as a sputtering apparatus or a vapor deposition apparatus or may be formed by discharging a droplet containing a conductive material by an ink-jet method or the like. However, the method for manufacturing the source and drain electrodes is not limited thereto.

Further, in a case where a plurality of the organic transistor 209 is included over the substrate 201, an organic semiconductor device 210 (FIG. 2C) can be formed through the same process.

As mentioned above, since the organic semiconductor layer 205 is formed in advance in the organic transistor 209 manufactured according to the present invention, the single crystal 206 of an organic semiconductor layer can be selectively formed and crystal growth can be realized thereafter. The single crystal can be used as a channel forming region and can increase carrier mobility.

Furthermore, there is a case where a crystal is not grown sufficiently for a channel area in a direction parallel to a substrate only with the single crystal 206 of an organic semiconductor layer. In such a case, the organic semiconductor layer 205 formed below the single crystal 206 of an organic semiconductor layer serves as a channel by being in contact with the source and drain electrodes or the gate insulating layer; thus, a yield can be improved.

Figure 9B:
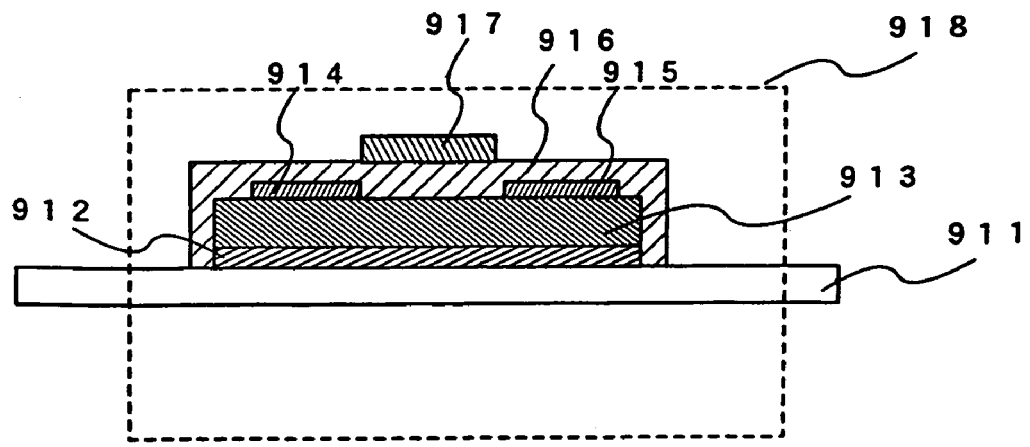

In addition, adhesion between the single crystal 206 of an organic semiconductor layer and the gate insulating layer 203 can be improved by providing the organic semiconductor layer 205. Consequently, off current of the organic transistor 209 can be decreased. Moreover, contact of the single crystal 206 of an organic semiconductor layer with the source and drain electrodes 207 and 208 can be improved by the organic semiconductor layer 205. Consequently, it is possible to reduce an injection barrier of a carrier, increase on current, and reduce a shift in threshold voltage. In this embodiment mode, a bottom-gate organic transistor is explained. However, the present invention also can be applied to a top-gate organic transistor. A top-gate organic transistor 918 according to this embodiment mode and a manufacturing method thereof will be explained with reference FIG. 9B. Firstly, a first semiconductor layer 912 is formed over a substrate 911 by using a vapor deposition method, an ink-jet method, a printing method, a stamp method, or the like. Secondly, a second semiconductor layer 913 is formed over the first semiconductor layer 912 by using an OMBE method, an HWE method, or a vapor-phased transport method such as a PVT. Thirdly, a source electrode 914 and a drain electrode 915 are formed over the second semiconductor layer 913 by using a well-known method. Then, a gate electrode 917 is formed over the source electrode 914 and the drain electrode 915 through a gate insulating layer 916 by using a well-known method.

Embodiment Mode 3

One mode of an organic semiconductor device according to the present invention and a manufacturing method thereof will be explained with reference to FIGS. 3 to 5.

A gate electrode 302 is formed over a substrate 301. The gate electrode 302 may be formed by patterning a deposited conductive layer into a desired shape by a photolithography method or by discharging a droplet containing a conductive material by an ink jet method or the like in the same manner as the above embodiments. As a material for forming the gate electrode 302, for example, aluminum, copper, gold, silver, or the like can be used. In addition, as the substrate 301, a flexible substrate such as plastic or polycarbonate can be used in addition to glass, quartz, or the like in the same manner as the above embodiments.

Next, a gate insulating layer 303 is formed to cover the gate electrode 302. The gate insulating layer 303 may be formed by depositing an insulator such as silicon oxide or silicon nitride by a CVD method or the like or may be formed by oxidizing the surface of the gate electrode with the use of an anodic oxidation method, for example. Alternatively, an organic material such as polyimide, polyamic acid, or polyvinylphenol may be coated by a method such as a cast method, a spinner method, a printing method, or an ink-jet method to form the gate insulating layer 303.

Then, an organic semiconductor device forming region 306 is manufactured by forming a source electrode 304 and an electrode 305 which serves as a drain electrode and an anode of a light-emitting element over the gate insulating layer 303 (FIG. 3). The source and drain electrodes 304 and 305 may be formed using an organic conductive material or the like containing poly (ethylene dioxythiophene)/poly (styrenesulfonic acid) mixture (PEDOT/PSS) or the like as well as an inorganic conductive material such as gold, silver, or tungsten in the same manner as the above embodiments. In addition, the anode 305 of a light-emitting element may also be formed using an organic conductive material or the like containing poly (ethylene dioxythiophene)/poly (styrenesulfonic acid) mixture (PEDOT/PSS) or the like as well as an inorganic conductive material such as gold, silver, or tungsten.

Moreover, when the anode is light transmitting, the above materials may be made extremely thin or a transparent conductive material such as indium tin oxide (ITO), zinc oxide (ZnO), indium zinc oxide (IZO), zinc oxide added with gallium (GZO), or indium tin oxide containing silicon oxide (ITSO) can be used to form the anode. Note that the material for the anode according to the present invention is not limited thereto. In addition, as a method for forming such a source electrode 304 and an electrode 305 which serves as a drain electrode and an anode of a light-emitting element, the electrodes may be formed by patterning into a desired shape a conductive layer formed with the use of a film forming apparatus such as a sputtering apparatus or a vapor deposition apparatus or may be formed by discharging a droplet containing a conductive material by an ink-jet method or the like. However, the manufacturing method is not limited thereto. In this embodiment mode, the drain electrode and anode 305 has a combined structure.

Figure 4:
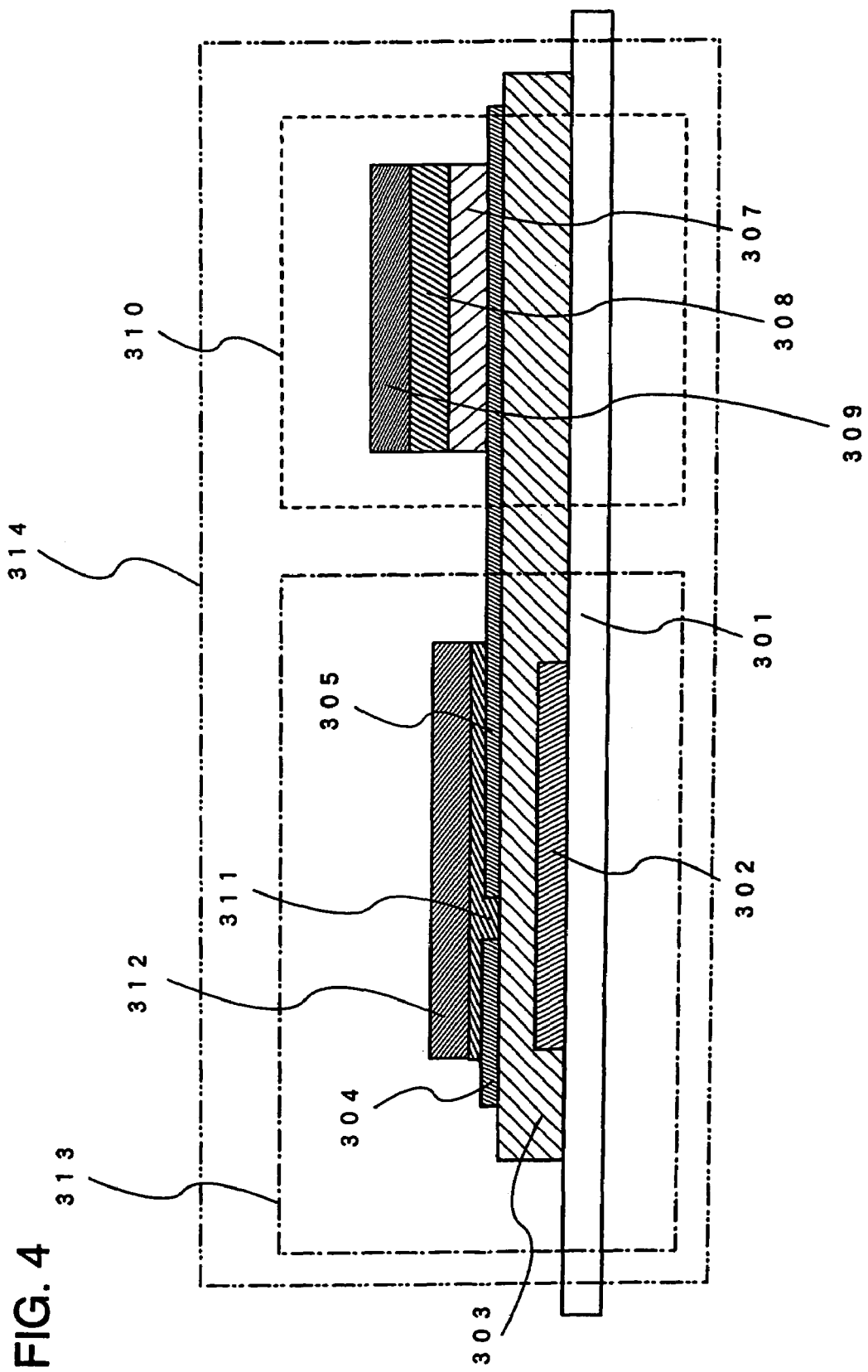
FIG. 4 is a cross-sectional view of an organic semiconductor device according to the present invention.

Subsequently, a hole-transporting organic semiconductor layer 307 is formed over the electrode 305 which serves as a drain electrode and an anode of a light-emitting element as shown in FIG. 4. As a method for forming the hole-transporting organic semiconductor layer 307, for example, a vapor deposition method, a spin-coating method, a printing method, an ink-jet method, or the like may be used. However, the manufacturing method is not limited thereto.

Next, a light-emitting layer and an electron-transporting organic semiconductor layer 308 are formed over the hole-transporting organic semiconductor layer 307. The hole-transporting organic semiconductor layer 307 includes a hole-transporting substance and a substance that shows electron acceptability against the substance. The hole-transporting substance is a substance having higher transportability of holes than that of electrons. For example, an aromatic amine compound such as 4,4'-bis[N-(1-naphthyl)-N-phenylamino]biphenyl (abbreviation: α-NPD), 4,4'-bis[N-(3-methylphenyl)-N-phenylamino]biphenyl (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), or 4,4'-bis[N-{4-(N,N-di-m-tolylamino)phenyl}-N-phenylamino]biphenyl (abbreviation: DNTPD), or an organic compound such as a phthalocyanine-based material typified by phthalocyanine ($H_2Pc$), phthalocyanine copper (CuPc), or vanadyl phthalocyanine (VoPc) can be used. Metal oxide such as molybdenum oxide, vanadium oxide, or rhenium oxide can be used for the substance that shows electron acceptability against the hole-transportable substance, for example.

As for a method for forming the hole-transporting organic semiconductor layer 307, for example, a vapor deposition method, a spin coating method, a printing method, an ink-jet method, or the like may be used. However, the material and manufacturing method of the hole-transporting layer are not limited thereto.

The light-emitting layer is preferable to have a layer in which a light-emitting substance is included to disperse in a layer formed of a substance having an energy gap larger than that of a light-emitting substance. Note that the light-emitting substance is a substance with preferable luminous efficiency, which can emit light with a desired emission wavelength. Note that the energy gap indicates an energy gap between the LUMO level and the HOMO level.

In order to obtain red light emission, for example, the following can be used for the light-emitting layer: 4-dicyanomethylene-2-isopropyl-6-[2-(1,1,7,7-tetramethyljulolidin-9-yl)ethenyl]-4H-pyran (abbreviation: DCJTI), 4-dicyanomethylene-2-methyl-6-[2-(1,1,7,7-tetramethyljulolidin-9-yl)ethenyl]-4H-pyran (abbreviation: DCJT), 4-dicyanomethylene-2-tert-butyl-6-[2-(1,1,7,7-tetramethyljulolidin-9-yl)ethenyl]-4H-pyran (abbreviation: DCJTB), periflanthen,2,5-dicyano-1,4-bis[2-(10-methoxy-1,1,7,7-tetramethyljulolidine-9-yl)ethenyl]benzene, bis[2,3-bis(4-fluorophenyl)quinoxalinato]iridium(acetylacetonato) (abbreviation: Ir[Fdpq]$_2$(acac)), or the like. However, the present invention is not limited to these materials and a substance which can emit light with a peak of emission spectrum in 600 nm or more and 680 nm or less can be used.

In order to obtain green light emission, N,N'-dimethylquinacridon (abbreviation: DMQd), coumarin 6, coumarin 545T, tris(8-quinolinolato)aluminum (abbreviation: Alq$_3$), or the like can be used. However, the present invention is not limited to these materials, and a substance which can emit light with a peak of emission spectrum in 500 nm or more and 550 nm or less can be used for the light-emitting layer.

In order to obtain blue light emission, the following can be used for the light-emitting layer: 9,10-bis(2-naphthyl)-tert-butylanthracene (abbreviation: t-BuDNA), 9,9'-bianthryl, 9,10-diphenylanthracene (abbreviation: DPA), 9,10-bis(2-naphthyl)anthracene (abbreviation: DNA), bis(2-methyl-8-quinolinolato)-4-phenylphenolate-gallium (abbreviation: BGaq), bis(2-methyl-8-quinolinolato)-4-phenylphenolate-aluminum (BAlq), or the like. However, the present invention is not limited to these materials, and a substance which can emit light with a peak of emission spectrum in 420 nm or more and 500 nm or less can be used.

As for a method for forming the light-emitting layer, for example, a vapor deposition method, a spin coating method, a printing method, an inkjet method, or the like may be used. However, the material and manufacturing method of the light-emitting layer are not limited thereto.

The electron-transporting organic semiconductor layer 308 includes a layer containing an electron-transporting substance and a substance that shows electron-donating properties against the substance. Note that the electron-transporting substance is a substance having higher transportability of electrons than that of holes. For example, a metal complex such as tris(8-quinolinolato)aluminum (abbreviation: Alq$_3$), tris(4-methyl-8-quinolinolato)aluminum (abbreviation: Almq$_3$), bis(10-hydroxybenzo[h]-quinolinato)beryllium (abbreviation: BeBq$_2$), bis(2-methyl-8-quinolinolato)-4-phenylphenolate-aluminum (abbreviation: BAlq), bis[2-(2-hydroxyphenyl)benzoxazolate]zinc (abbreviation: Zn(BOX)$_2$), or bis[2-(2-hydroxyphenyl)benzothiazolate]zinc (abbreviation: Zn(BTZ)$_2$) can be used. In addition, the following substance can be used as the electron-transporting substance: 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen); bathocuproin (abbreviation: BCP), 4,4'-bis(5-methyl-benzoxazol-2-yl)stilbene (abbreviation: BzOS), or the like. However, the electron-transporting substance is not limited thereto.

As for a method for forming the electron-transporting organic semiconductor layer 308, for example, a vapor deposition method, a spin coating method, a printing method, an ink-jet method, or the like may be used. However, the material and manufacturing method of the electron-transporting layer are not limited thereto.

Next, a cathode 309 of a light-emitting element is formed over the electron-transporting organic semiconductor layer 308. The cathode 309 of the light-emitting element may be formed using an inorganic conductive material such as aluminum, magnesium, or calcium. When the cathode is light transmitting, the above materials may be made extremely thin or a transparent conductive material such as indium tin oxide (ITO), zinc oxide (ZnO), indium zinc oxide (IZO), zinc oxide added with gallium (GZO), or indium tin oxide containing silicon oxide (ITSO) can be used to form the anode. Note that the cathode material according to the present invention is not limited thereto.

A portion composed of the anode 305 of a light-emitting element, the hole-transporting organic semiconductor layer 307, the light-emitting layer, the electron-transporting organic semiconductor layer 308, the cathode 309 of a light-emitting element is referred to as a light-emitting element 310.

Then, an organic semiconductor layer 311 is formed in a place for forming a channel over the organic semiconductor device forming region 306. In other words, the organic semiconductor layer 311 is selectively formed in a region where a single crystal of an organic semiconductor layer is formed. As a result of providing the organic semiconductor layer 311, a single crystal of an organic semiconductor layer can be formed efficiently thereover; thus, a single crystal can be grown from the region.

The organic semiconductor layer 311 may be formed of a material serving as a channel, specifically; the material can be selected from the materials shown in the above embodiment modes. Such an organic semiconductor layer 311 is formed to be 2 nm or more and 10 nm or less in thickness. The organic semiconductor layer 311 may be formed using a vapor deposition method, an ink-jet method, a printing method, a stamp method, or the like. However, the method for manufacturing the organic semiconductor layer 311 according to the present invention is not limited thereto.

The organic semiconductor layer 311 can bring about an effect of the present invention when an organic semiconductor layer having the same crystal state as that of a single crystal of an organic semiconductor layer that will be subsequently formed is used. For example, in a case of using a single crystal of an organic semiconductor layer as an organic semiconductor layer that will be subsequently formed, it is preferable to use for the organic semiconductor layer 311 an organic semiconductor layer having such high crystallinity as that in a single crystalline or a polycrystalline state. In addition, in a case of forming a polycrystalline organic semiconductor layer, it is preferable to use an organic semiconductor layer in a polycrystalline state for the organic semiconductor layer 311.

Next, a single crystal 312 of an organic semiconductor layer is formed over the organic semiconductor layer 311 as an organic semiconductor layer having high crystallinity to complete an organic transistor 313. The film forming method of the single crystal 312 of an organic semiconductor layer is the same as the above embodiments. For example, a phthalocyanine-based material such as phthalocyanine (H$_2$Pc), phthalocyanine copper (CuPc), titanyl phthalocyanine (TiOPc), or vanadyl phthalocyanine (VoPc), an acene-based material such as anthracene, tetracene, or pentacene, a thiophene-oligomer-based material such as sexithiophene (α-6T) or quarterthiophene (α-4T), or other material such as fullerene (C60) or perylene can be used to form the single crystal 312 of an organic semiconductor by a vapor-phase transport method. Since the organic semiconductor layer 311 is formed in advance according to the present invention, the single crystal 312 of an organic semiconductor layer can be formed selectively and efficiently; thus, crystal growth can be realized.

Such a light-emitting element 310 and an organic transistor 313 are used to constitute an organic semiconductor device 314.

Figure 5:
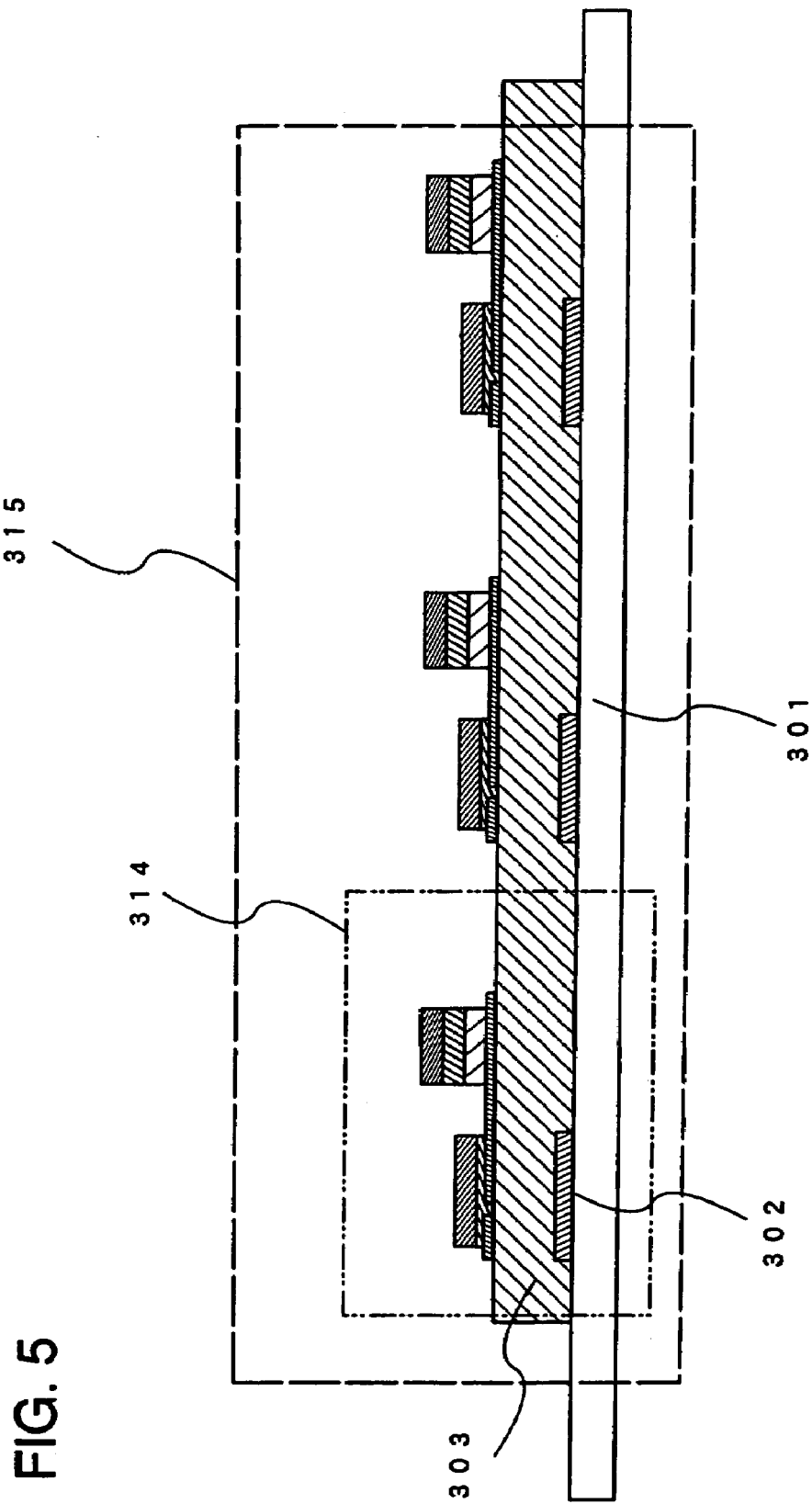
FIG. 5 is a cross-sectional view of a display device according to the present invention.

Further, in a case where a plurality of the organic semiconductor device 314 is included over the substrate 301, a display device 315 can be formed through the same process (FIG. 5).

As mentioned above, since the organic semiconductor layer 311 is formed in advance in the organic semiconductor device 314 manufactured according to the present invention, the single crystal 312 of an organic semiconductor layer can be selectively formed and crystal growth can be realized thereafter. The single crystal can be used as a channel forming region and can increase carrier mobility.

Furthermore, there is a case where a crystal is not grown sufficiently for a channel area in a direction parallel to a substrate only with the single crystal 312 of an organic semiconductor layer. In such a case, the organic semiconductor layer 311 formed below the single crystal 312 of an organic semiconductor layer serves as a channel; thus, a yield can be improved.

In addition, adhesion between the single crystal 312 of an organic semiconductor layer and the gate insulating layer 303 can be improved by providing the organic semiconductor layer 311. Consequently, off current of the organic transistor 313 can be decreased. Moreover, contact of the single crystal 312 of an organic semiconductor layer with the source and drain electrodes 304 and 305 can be improved by the organic semiconductor layer 311. Consequently, it is possible to reduce an injection barrier of a carrier, increase on current, and reduce a shift in threshold voltage. This embodiment mode can be freely combined with the above-mentioned embodiment mode.

Embodiment Mode 4

An organic transistor according to the present invention can be mounted on a television device (also referred to as a television or a television receiver), a camera such as a digital camera or a digital video camera, a cellular phone device (also referred to as a cellular phone handset or a cellular phone), a portable information terminal such as a PDA, a portable game machine, a computer monitor, a computer, an audio reproducing device such as a car audio, an image reproducing device provided with a recording medium such as a home game machine, or the like. In particular, the organic transistor according to the present invention can be applied as a switching transistor of a pixel portion. Specific examples of such electronic devices will be explained with reference to FIGS. 8A to 8D.

Figure 8A:
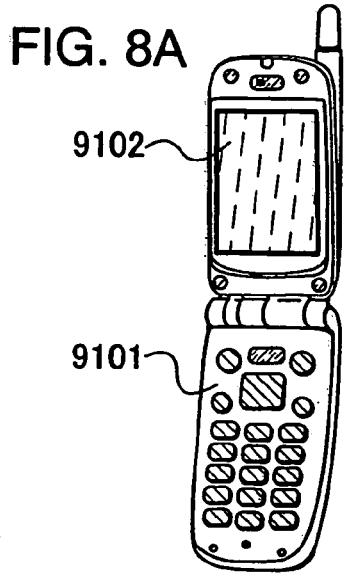
FIGS. 8A to 8D are views each showing an electronic device on which an organic transistor according to the present invention is mounted.

A cellular phone handset shown in FIG. 8A includes a main body 9101, a display portion 9102, and the like. The organic transistor according to the present invention can be mounted as a switching transistor of the display portion 9102. Consequently, an organic transistor having high carrier mobility is mounted; thus, it is possible to provide a cellular phone handset manufactured by a low-temperature process.

Figure 8B:
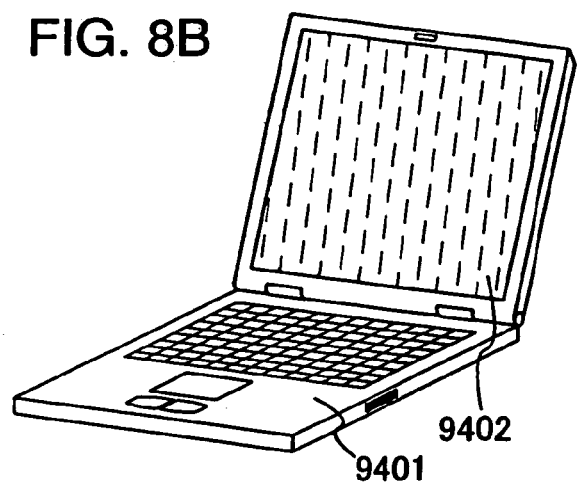

A laptop computer shown in FIG. 8B includes a main body 9401, a display portion 9402, and the like. The organic transistor according to the present invention can be mounted as a switching transistor of the display portion 9402. Consequently, an organic transistor having high carrier mobility is mounted; thus, it is possible to provide a laptop computer manufactured according to a low-temperature process.

Figure 8C:
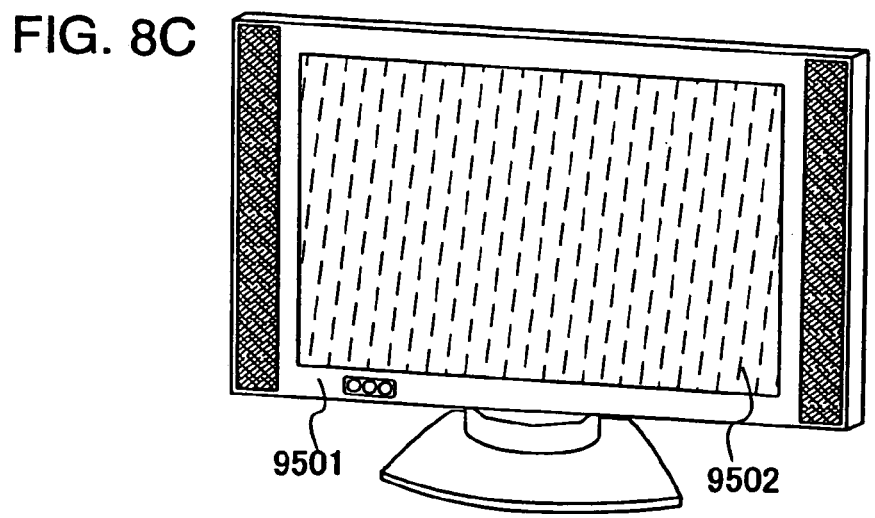

A television device shown in FIG. 8C includes a main body 9501, a display portion 9502, and the like. The organic transistor according to the present invention can be mounted as a switching transistor of the display portion 9502. Consequently, an organic transistor having high carrier mobility is mounted; thus, it is possible to provide a television set manufactured according to a low-temperature process.

Figure 8D:
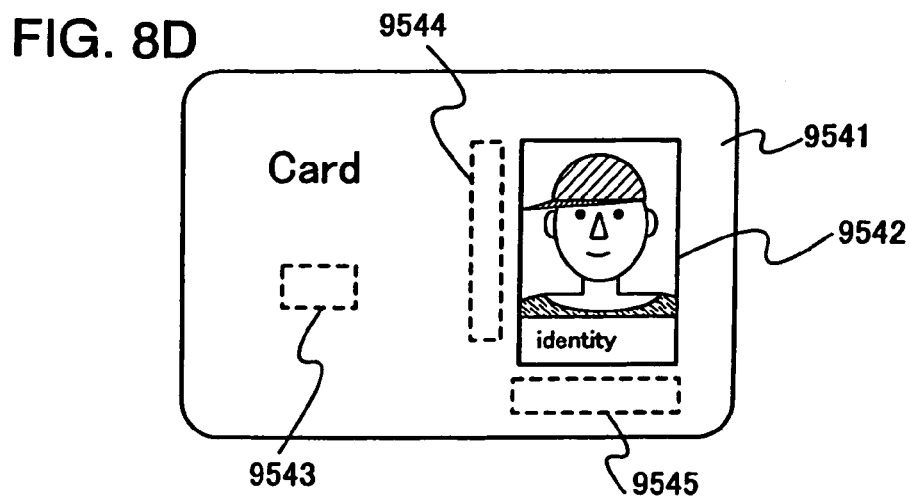

A card shown in FIG. 8D includes a supporting body 9541, a display portion 9542, an integrated circuit chip 9543 such as a memory incorporated in the supporting body 9541, and the like. The organic transistor according to the present invention can be mounted as a switching transistor of the display portion 9542. Consequently, an organic transistor having high carrier mobility is mounted; thus, it is possible to provide a card manufactured according to a low-temperature process.

According to the present invention, an organic transistor having high carrier mobility can be applied to a switching transistor used for a pixel portion of an electronic device. Then, power consumption and a cost of an electronic device may be reduced. This embodiment mode can be freely combined with the above-mentioned embodiment mode.

Embodiment

This embodiment will explain that much preferable organic transistor properties can be obtained by implementing the present invention.

Tungsten is formed over a quartz substrate 101 in 100 nm thick by a sputtering method. This tungsten is patterned by a photolithography method to form a gate electrode 102. A gate insulating layer 103 of SiON is formed over the gate electrode 102 by a CVD method.

Tungsten is formed over the gate insulating layer 103 in 100 nm thick by a sputtering method and patterned by a photolithography method to form source and drain electrodes 104 and 105. A channel length and a channel width between the source and drain electrodes are 5 μm and 8 mm, respectively.

An organic semiconductor, pentacene, is formed in 2.5 nm thick over the gate insulating layer 103, and the source and drain electrodes 104 and 105 by a vapor deposition method to serve as an organic semiconductor layer 107.

Next, a single crystal 108 of an organic semiconductor layer is formed over the organic semiconductor layer 107 with the use of a vapor-phase transport method. In Embodiment 1, a single crystal of pentacene is formed by a vapor-phase transport method. Physical properties of an organic semiconductor are significantly affected by slight impurities of several ppm; therefore, purification has to be adequately performed in order to realize single crystal growth of an organic semiconductor layer. It is important to perform optimum purification by utilizing the difference of chemical properties between individual compound and impurities. In this embodiment, pentacene to be a single crystal is used by being purified for 6 times or more by a sublimation purification method. It is desirable to set the purity of the organic semiconductor layer to 99.9% or more as an indicator of mixture of definitive impurities.

A single crystal of pentacene is grown by a vapor-phase transport method with the use of this sample. A vapor-phase transport method refers to a method for performing crystal growth by flowing carrier gas slowly to a glass tube where there is a temperature gradient and transporting the sample sublimated at a high-temperature portion with the carrier gas. In this embodiment, the glass tube is vacuum evacuated and the carrier gas of Ar flows in 10 ml/min so that the degree of vacuum in the glass tube becomes approximately 25 Pa and then pentacene that is the sample is heated up to 220° C. A single crystal can be selectively obtained over pentacene that is the organic semiconductor layer 107 after the sublimated pentacene is transported by the carrier gas of Ar.

Figure 6A:
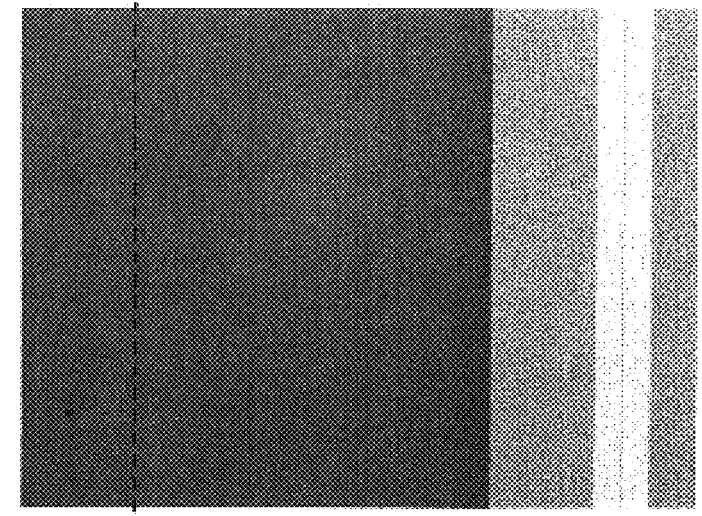
FIGS. 6A and 6B are views each showing selectivity of a growth position in a single crystal of an organic transistor according to the present invention.
Figure 6B:
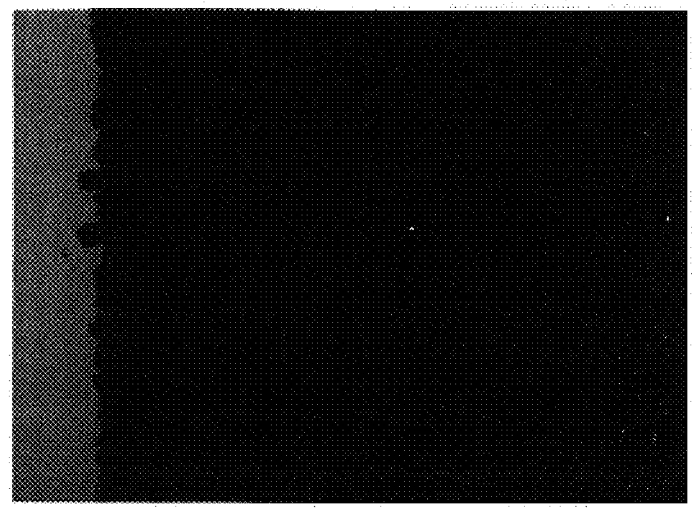

FIGS. 6A and 6B each show a state of an organic transistor 109. In FIG. 6A, the left side of a dotted line portion is a region where pentacene that is the organic semiconductor layer 107 is not formed, and the right side is a region where pentacene that is the organic semiconductor layer 107 is formed to be 2.5 nm in thickness. In FIG. 6B, a state where the single crystal 108 of an organic semiconductor layer is formed is shown. It is found that the single crystal 108 of an organic semiconductor layer is not formed in the region where pentacene that is the organic semiconductor layer 107 is not formed but formed in the region where pentacene that is the organic semiconductor layer 107 is formed. It is found that the single crystal 108 of an organic semiconductor layer is formed efficiently and selectively by providing pentacene that is the organic semiconductor layer 107.

Therefore, in order to obtain a single crystal of a preferable organic semiconductor layer, a larger and preferable single crystal can be obtained with efficiency by providing such a condition that optimum carrier gas is selected and a flow rate thereof is suppressed, distribution of the glass tube in temperature gradient is adjusted, or a degree of supersaturation (degree of difference between equilibrium vapor pressure and actual vapor pressure) is suppressed. The organic transistor 109 is manufactured by forming the single crystal 108 of an organic semiconductor layer over pentacene that is the organic semiconductor layer 107.

Figure 7:
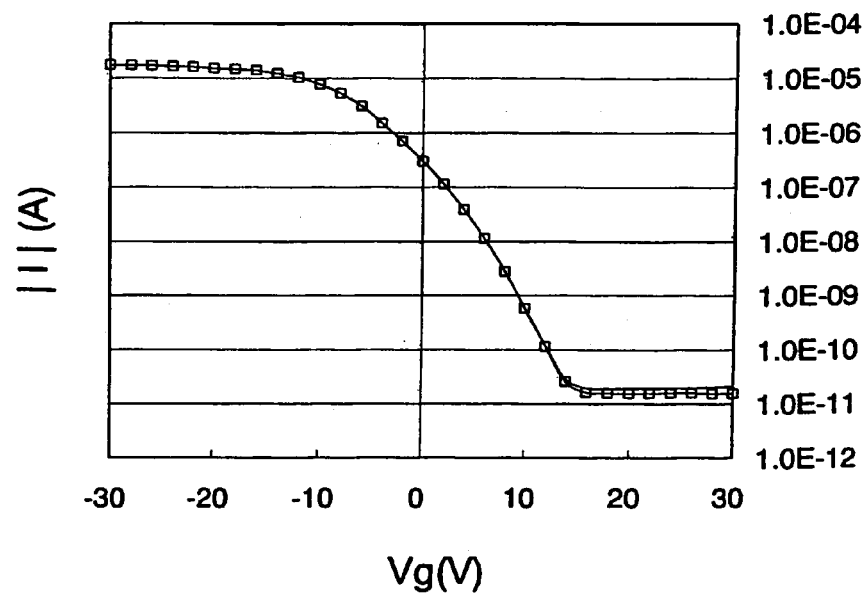
FIG. 7 is a diagram showing a transistor characteristic of an organic transistor according to the present invention.

The organic transistor 109 is measured under vacuum at room temperature. The organic transistor 109 is measured by being set in a cryostat, which is vacuumed up to $1.0 \times 10^0$ Pa or less by a rotary pump. The measured Id-Vg characteristic is shown in FIG. 7. This is a result of the measurement by applying a gate voltage of −30V or more and 30 V or less with the fixture of a drain voltage at −10 V.

According to the present invention, adhesion between the gate insulating layer and a single crystal of pentacene is improved, and off current is decreased up to $10^{-11}$ A by inserting the organic semiconductor layer of pentacene. In addition, as a result of improving contact between the source and drain electrodes and the single crystal of pentacene, it is possible to reduce an injection barrier of a carrier, increase on current, and reduce a shift in threshold voltage. Moreover, since the organic semiconductor layer 107 of pentacene is formed in advance over a formation region of the single crystal, incomplete channel formation only with the single crystal 108 of pentacene can be prevented, the organic semiconductor layer 107 of pentacene can operate as a channel that compensates a portion where a channel is not formed, and thus the organic transistor 109 can be obtained in a preferable yield. Further, it is possible to reduce loss of an organic semiconductor material (pentacene) by selectively growing the single crystal of pentacene.

The present application is based on Japanese Patent Application serial No. 2005-087133 filed on Mar. 24, 2005 in Japanese Patent Office, the entire contents of which are hereby incorporated by reference.

What is claimed is:

1. A semiconductor device comprising:
a gate electrode;
a gate insulating layer over the gate electrode;
a first organic semiconductor layer over the gate insulating layer; and
a second organic semiconductor layer over the first organic semiconductor layer,
wherein the second organic semiconductor layer has a crystal grain larger than that of the first organic semiconductor layer.

2. A semiconductor device according to claim 1, wherein the film thickness of the first organic semiconductor layer is 2 nm or more and 10 nm or less.

3. A semiconductor device according to claim 1, wherein the first organic semiconductor layer and the second organic semiconductor layer are formed of the same material.

4. A semiconductor device according to claim 1, wherein the first organic semiconductor layer and the second organic semiconductor layer each comprises a material selected from the group consisting of an acene-based material, a thiophene-oligomer-based material, fullerene (C60), perylene and an aromatic amine compound.

5. A semiconductor device according to claim 1, wherein the semiconductor device is incorporated into an electronic device selected from the group consisting of a television device, a cellular phone, a portable information terminal, a portable game machine, a computer monitor, a computer, an audio reproducing device, camera and an image reproducing device.

6. A semiconductor device according to claim 1, wherein the first organic semiconductor layer is formed over the gate insulating layer, and the second organic semiconductor layer is formed over the first organic semiconductor layer.

7. A semiconductor device comprising:
a gate electrode;
a gate insulating layer over the gate electrode;
a first electrode and a second electrode over the gate insulating layer;
a light-emitting layer over a first part of the second electrode;
a conductive layer over the light-emitting layer;
a first organic semiconductor layer over the gate insulating layer, wherein the first organic semiconductor layer overlaps with a part of the first electrode and a second part of the second electrode; and
a second organic semiconductor layer over the first organic semiconductor layer,
wherein the second organic semiconductor layer has a crystal grain larger than that of the first organic semiconductor layer.

8. A semiconductor device according to claim 7, wherein the film thickness of the first organic semiconductor layer is 2 nm or more and 10 nm or less.

9. A semiconductor device according to claim 7, wherein the first organic semiconductor layer and the second organic semiconductor layer are formed of the same material.

10. A semiconductor device according to claim 7, wherein the first organic semiconductor layer and the second organic semiconductor layer each comprises a material selected from the group consisting of an acene-based material, a thiophene-oligomer-based material, fullerene (C60), perylene and an aromatic amine compound.

11. A semiconductor device according to claim 7, wherein the semiconductor device is incorporated into an electronic device selected from the group consisting of a television device, a cellular phone, a portable information terminal, a portable game machine, a computer monitor, a computer, an audio reproducing device, camera and an image reproducing device.

12. A semiconductor device according to claim 7, wherein the first organic semiconductor layer is formed over the gate insulating layer, and the second organic semiconductor layer is formed over the first organic semiconductor layer.

13. A semiconductor device comprising:
a gate electrode;
a gate insulating layer over the gate electrode;
a first organic semiconductor layer over the gate insulating layer; and
a second organic semiconductor layer over the first organic semiconductor layer,
wherein the first organic semiconductor layer comprises a polycrystalline structure, and
wherein the second organic semiconductor layer comprises a single crystalline structure.

14. A semiconductor device according to claim 13, wherein the film thickness of the first organic semiconductor layer is 2 nm or more and 10 nm or less.

15. A semiconductor device according to claim 13, wherein the first organic semiconductor layer and the second organic semiconductor layer are formed of the same material.

16. A semiconductor device according to claim 13, wherein the first organic semiconductor layer and the second organic semiconductor layer each comprises a material selected from the group consisting of an acene-based material, a thiophene-oligomer-based material, fullerene (C60), perylene and an aromatic amine compound.

17. A semiconductor device according to claim 13, wherein the semiconductor device is incorporated into an electronic device selected from the group consisting of a television device, a cellular phone, a portable information terminal, a portable game machine, a computer monitor, a computer, an audio reproducing device, camera and an image reproducing device.

18. A semiconductor device according to claim 13, wherein the first organic semiconductor layer is formed over the gate insulating layer, and the second organic semiconductor layer is formed over the first organic semiconductor layer.

19. A semiconductor device comprising:
a gate electrode;
a gate insulating layer over the gate electrode;
a first electrode and a second electrode over the gate insulating layer;
a light-emitting layer over a first part of the second electrode;
a conductive layer over the light-emitting layer;
a first organic semiconductor layer over the gate insulating layer, wherein the first organic semiconductor layer overlaps with a part of the first electrode and a second part of the second electrode; and
a second organic semiconductor layer over the first organic semiconductor layer,
wherein the first organic semiconductor layer comprises a polycrystalline structure, and
wherein the second organic semiconductor layer comprises a single crystalline structure.

20. A semiconductor device according to claim 19, wherein the film thickness of the first organic semiconductor layer is 2 nm or more and 10 nm or less.

21. A semiconductor device according to claim 19, wherein the first organic semiconductor layer and the second organic semiconductor layer are formed of the same material.

22. A semiconductor device according to claim 19, wherein the first organic semiconductor layer and the second organic semiconductor layer each comprises a material selected from the group consisting of an acene-based material, a thiophene-oligomer-based material, fullerene (C60), perylene and an aromatic amine compound.

23. A semiconductor device according to claim 19, wherein the semiconductor device is incorporated into an electronic device selected from the group consisting of a television device, a cellular phone, a portable information terminal, a portable game machine, a computer monitor, a computer, an audio reproducing device, camera and an image reproducing device.

24. A semiconductor device according to claim 19, wherein the first organic semiconductor layer is formed over the gate insulating layer, and the second organic semiconductor layer is formed over the first organic semiconductor layer.

* * * * *